United States Patent
Chou et al.

(10) Patent No.: US 12,424,477 B2
(45) Date of Patent: Sep. 23, 2025

(54) WAFER CHUCK

(71) Applicant: Powerchip Semiconductor Manufacturing Corporation, Hsinchu (TW)

(72) Inventors: Chun-Chi Chou, Hsinchu (TW); Chung-Ming Kuo, Hsinchu County (TW); Bo-An Tsai, Hsinchu (TW); Shyng-Yeuan Che, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 144 days.

(21) Appl. No.: 18/518,586

(22) Filed: Nov. 23, 2023

(65) Prior Publication Data

US 2025/0132183 A1    Apr. 24, 2025

(30) Foreign Application Priority Data

Oct. 20, 2023   (TW) .................................. 112140285

(51) Int. Cl.
*H01T 23/00* (2006.01)
*H01L 21/67* (2006.01)
*H01L 21/683* (2006.01)

(52) U.S. Cl.
CPC .... *H01L 21/6833* (2013.01); *H01L 21/67098* (2013.01)

(58) Field of Classification Search
None
See application file for complete search history.

(56) References Cited

U.S. PATENT DOCUMENTS

| | | | |
|---|---|---|---|
| 5,001,423 A | | 3/1991 | Abrami et al. |
| 5,331,273 A | * | 7/1994 | Schneider ................ G01R 1/04 324/763.01 |
| 5,901,030 A | | 5/1999 | Logan et al. |
| 6,583,638 B2 | * | 6/2003 | Costello ............ H01L 21/67109 324/750.28 |
| 2011/0092072 A1 | * | 4/2011 | Singh ...................... C23C 14/50 156/345.52 |

FOREIGN PATENT DOCUMENTS

TW             202105584             2/2021

OTHER PUBLICATIONS

"Office Action of Taiwan Counterpart Application", issued on Apr. 28, 2025, p. 1-p. 6.

* cited by examiner

*Primary Examiner* — Stephen W Jackson
(74) *Attorney, Agent, or Firm* — JCIPRNET

(57) ABSTRACT

The present disclosure provides a wafer chuck including a substrate and a heating/cooling wafer. The substrate includes a first surface facing a wafer to be carried and a second surface opposite to the first surface. The heating/cooling wafer is disposed on the first surface of the substrate and includes a plurality of heating/cooling units arranged in an array. In a direction perpendicular to the first surface, the positions of the heating/cooling units and the positions of a plurality of dies included in the wafer to be carried are corresponded with each other, and the heating/cooling units can heat or cool the corresponding dies individually.

6 Claims, 3 Drawing Sheets

WAFER CHUCK

CROSS-REFERENCE TO RELATED APPLICATION

This application claims the priority benefit of Taiwan application serial no. 112140285, filed on Oct. 20, 2023. The entirety of the above-mentioned patent application is hereby incorporated by reference herein and made a part of this specification.

BACKGROUND

Technical Field

The present invention is related to a chunk for a semiconductor process, and particular to a wafer chunk for a semiconductor process.

Description of Related Art

In general, using a semiconductor wafer as a substrate and forming various layers/structures/elements on the substrate are commonly known processes for forming a semiconductor device. The semiconductor wafer needs to be flat during the processes and needs to be transported to different sites for different processes. Vacuum chucks and electrostatic chucks that fix the semiconductor wafer thereon based on different principles are wafer carriers that meet the above requirements.

As the name suggests, the vacuum chuck utilizes vacuum to fix the semiconductor wafer on the chuck. However, the suction generated by the vacuum may be affected by some factors. For example, when the size of the semiconductor wafer increases and/or the number of the layers/structures/elements stacked on the semiconductor wafer increases, a deformation (such as warpage) of the semiconductor wafer will become significant and thus the surface of the semiconductor wafer that faces the vacuum chuck deviates from the flat plane, or when the particles generated during the processes are sucked into the space between the vacuum chuck and the semiconductor wafer, the surface of the semiconductor wafer that faces the vacuum chuck deviates from the flat plane. Either of these situations will cause gaps existing between the vacuum chuck and the semiconductor wafer, so that the external gas will flow into the gaps and thus cannot generate sufficient vacuum degree to fix the semiconductor wafer on the vacuum chuck.

On the other hands, the electrostatic chuck (ESC) uses polarization charges to fix the semiconductor wafer on the chuck. Specifically, when a voltage is applied on the electrostatic chuck, the charges arranged at the rear side of the semiconductor wafer will have opposite polarity to the charges arranged on the electrostatic chuck, so that the semiconductor wafer will be fixed on the electrostatic chuck. From here, the electrostatic chuck does not have those problems caused by the gaps between the semiconductor wafer and the vacuum chuck.

In the current designs, the electrostatic chucks are designed to dissipate heat that generates during the semiconductor processes (e.g., heat generated during the chemical vapor deposition (CVD) process or the etching process) to improve the yield of semiconductor processes, so surfaces of the electrostatic chucks facing the semiconductor wafer are provided with channels which cooling gases (e.g., helium gas) flow therein and therefore the waste heat generated during the processes will be dissipated through the cooling gases.

However, some issues coming from the above designs have to considered. For example, when particles generated during the process adhere between the electrostatic chuck and the semiconductor wafer, the cooling gases may leak slightly in an amount that does not affect the process, but this leakage will cause unnecessary shutdown procedure and thereby affecting the entire manufacturing processes. On the other hands, during the step of removing the electrostatic force used to clamp the semiconductor wafer, if there are undischarged cooling gases remaining in the channel, the pressure on the rear side of the semiconductor wafer will be greater than the pressure on the front side of the semiconductor wafer. Therefore, once the electrostatic force holding the semiconductor wafer is removed, the semiconductor wafer will be blown away by the cooling gases remaining in the channels and then will be smashed into fragments. This result will have a considerable impact in every aspect of the semiconductor process.

SUMMARY

The present invention provides a wafer chuck in which the heating/cooling wafer is disposed on a surface of the substrate that faces a wafer to be carried and includes a plurality of heating/cooling units arranged in an array. As such, the heat generated during the semiconductor processes can be cooled through the heating/cooling wafer without cooling through the cooling gases. Therefore, during the step of removing the electrostatic force used to clamp the wafer, the wafer will not be blown away by the cooling gases remaining in the channels, thereby avoiding the result that the wafer is smashed into fragments. On the other hands, even if the particles generated during the process adhere to the space between the wafer chuck and the wafer, the unnecessary shutdown procedure caused by the leakage of the cooling gases in an amount that does not affect the process will not occur.

In other aspects, since the positions of the heating/cooling units are designed to correspond to the positions of the dies included in the wafer to be carried, the corresponding heating/cooling units are capable of heating or cooling corresponding dies independently.

An embodiment of the invention provides a wafer chuck including a substrate and a heating/cooling wafer. The substrate includes a first surface facing a wafer to be carried and a second surface opposite to the first surface. The heating/cooling wafer is disposed on the first surface of the substrate and comprising a plurality of heating/cooling units arranged in an array, wherein positions of the heating/cooling units and positions of a plurality of dies including in the wafer to be carried are corresponded to each other in a direction perpendicular to the first surface, so that the heating/cooling units are capable of heating or cooling corresponding dies independently.

In some embodiments, the plurality of heating/cooling units overlap the plurality of dies in the direction perpendicular to the first surface.

In some embodiments, the wafer chuck further includes clamping device disposed between the substrate and the heating/cooling wafer and including a plurality of electrodes.

In some embodiments, the clamping device is free of a channel which gas flows therein.

In some embodiments, a channel which cooling gas flows therein does not exist between the first surface of the substrate and the wafer to be carried substrate.

In some embodiments, the substrate includes a pipe buried therein, the pipe includes an inlet and an outlet at opposite ends of the pipe, and the inlet and the outlet are opened on the second surface of the substrate.

In some embodiments, each of the heating/cooling units includes a first and a second electrodes spaced apart from each other, a conductive layer above the first and the second electrodes, a first semiconductor layer between the first electrode and the conductive layer and having a first conductivity type, and a second semiconductor layer between the second electrode and the conductive layer and being spaced apart from the first semiconductor layer, wherein the second semiconductor layer has a second conductivity type different from the first conductivity type.

In some embodiments, the conductive layer contacts the die.

Based on the above, in the aforementioned embodiment of the wafer chuck, the heating/cooling wafer is disposed on a surface of the substrate that faces a wafer to be carried and includes a plurality of heating/cooling units arranged in an array. As such, the heat generated during the semiconductor processes can be cooled through the heating/cooling wafer without cooling through the cooling gases. Therefore, during the step of removing the electrostatic force used to clamp the wafer, the wafer will not be blown away by the cooling gases remaining in the channels, thereby avoiding the result that the wafer is smashed into fragments. On the other hands, even if the particles generated during the process adhere to the space between the wafer chuck and the wafer, the unnecessary shutdown procedure caused by the leakage of the cooling gases in an amount that does not affect the process will not occur.

In other aspects, since the positions of the heating/cooling units are designed to correspond to the positions of the dies included in the wafer to be carried, the corresponding heating/cooling units are capable of heating or cooling corresponding dies independently.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
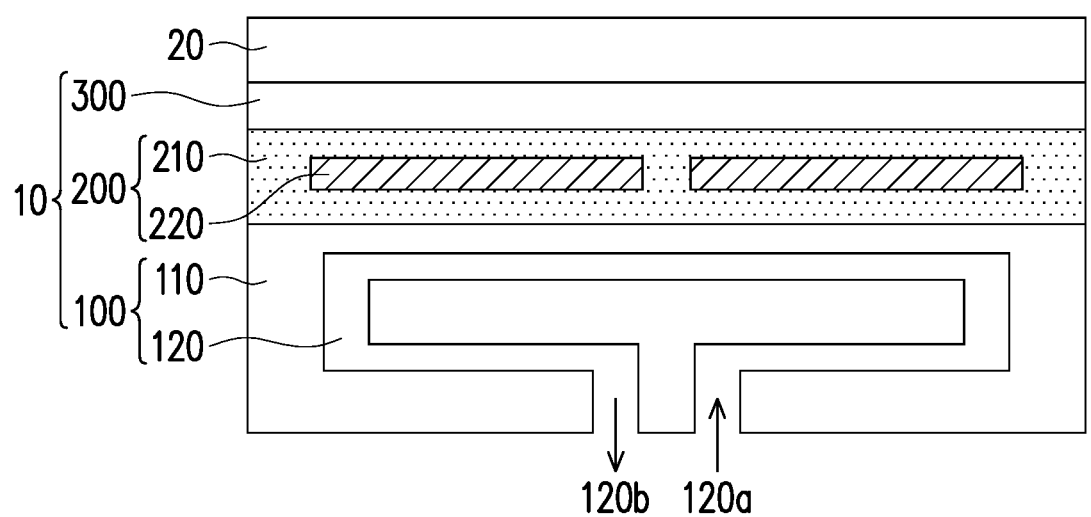
FIG. 1 is a schematic cross-section view illustrating a wafer chuck of an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 2:
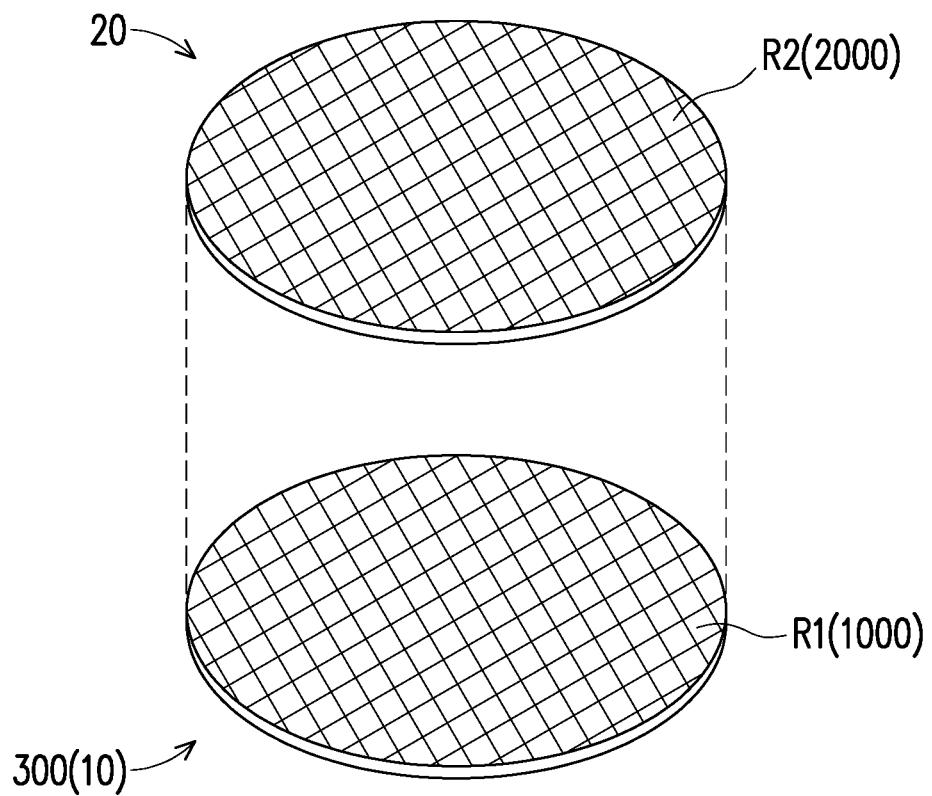
FIG. 2 is a schematic cross-section view illustrating a relative position of the wafer chuck and the wafer to be carried in an embodiment of the invention.
Figure 3:
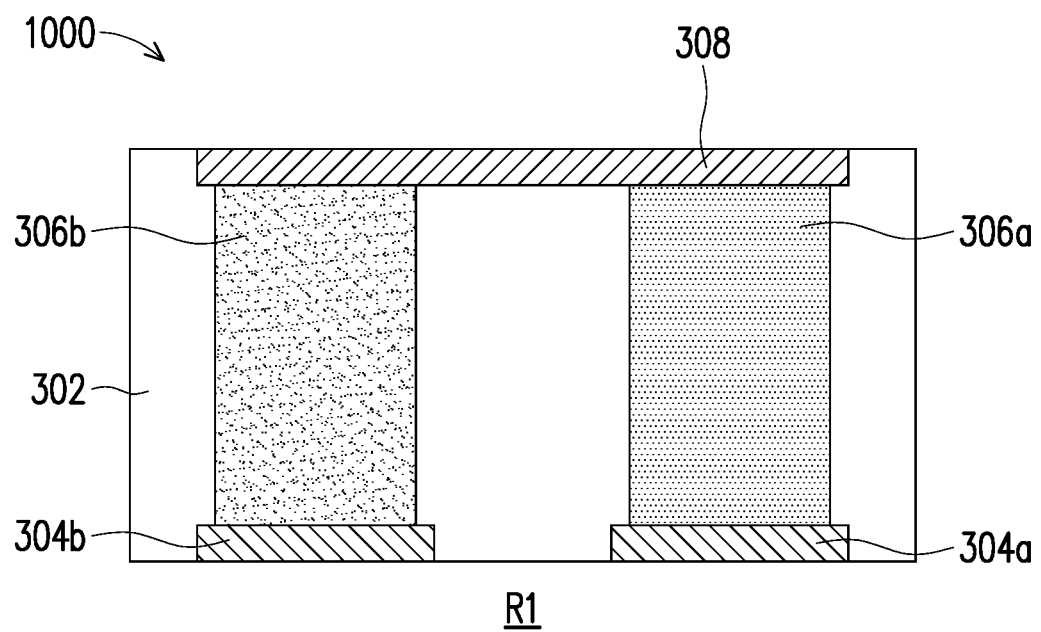
FIG. 3 is a schematic cross-section view illustrating a clamping device of an embodiment of the invention.

FIG. 1 is a schematic cross-section view illustrating a wafer chuck of an embodiment of the invention. FIG. 2 is a schematic cross-section view illustrating a relative position of the wafer chuck and the wafer to be carried in an embodiment of the invention. FIG. 3 is a schematic cross-section view illustrating a clamping device of an embodiment of the invention.

Referring to FIG. 1, a wafer chuck 10 includes a substrate 100 and a heating/cooling wafer 300. The substrate 100 includes a first surface facing a wafer 20 to be carried and a second surface opposite to the first surface. In some embodiments, the substrate 100 may include a chuck body 110 and a pipe 120 buried therein. The chuck body 110 may be formed by using any suitable material. In some embodiments, the chuck body 110 may be formed of dielectric materials (e.g., aluminum oxide or aluminum nitride), or may include silicon carbide having good thermal conductivity properties. The pipe 120 may include an inlet 120a and an outlet 120b at opposite ends of the pipe 120, and the inlet 120a and the outlet 120b are opened on the second surface of the substrate 100. In some embodiments, the cooling water may flow in the pipe 120 to perform heat exchange with the heating/cooling wafer 300.

The heating/cooling wafer 300 is disposed on the first surface of the substrate 100 and includes a plurality of heating/cooling units arranged in an array (e.g., heating/cooling units 1000 shown in FIG. 2 or FIG. 3). As such, the heat generated during the semiconductor processes that are performed on the wafer 20 can be cooled through the heating/cooling wafer 300 of the wafer chuck 10 without cooling through the cooling gases. Therefore, during the step of removing the electrostatic force used to clamp the wafer 20, the wafer 20 will not be blown away by the cooling gases remaining in the channels, thereby avoiding the result that the wafer 20 is smashed into fragments. On the other hands, even if the particles generated during the process adhere to the space between the wafer chuck 10 and the wafer 20, the unnecessary shutdown procedure caused by the leakage of the cooling gases in an amount that does not affect the process will not occur. In some embodiments, a channel which cooling gas flows therein does not exist between the first surface of the substrate 100 and the wafer 20 to be carried.

Referring to FIG. 1 and FIG. 2, positions of the heating/cooling units 1000 and positions of a plurality of dies 2000 including in the wafer 20 to be carried are corresponded to each other in a direction perpendicular to the first surface of the substrate 100, so that the heating/cooling units 1000 are capable of heating or cooling corresponding dies 2000 independently. As such, the wafer chuck 10 is capable of controlling the temperature of each die 2000 in the wafer 20 accurately, so that the wafer 20 in various areas has the same or similar temperature. In some embodiments, since the corresponding heating/cooling unit 1000 is capable of heating or cooling the corresponding die 2000, a specific temperature distribution can be obtained according to the requirements. In some embodiments, the heating/cooling units 1000 overlap the dies 2000 in the direction perpendicular to the first surface of the substrate 100. For example, the heating/cooling unit 1000 in a region R1 of the heating/cooling wafer 300 and the die 2000 in a region R2 of the wafer 20 are corresponded to each other and are overlapped with each other in the direction perpendicular to the first surface of the substrate 100.

In some embodiments, the wafer chuck 10 includes a clamping device 200 disposed between the substrate 100 and the heating/cooling wafer 300. The clamping device 200 may include a base layer 210 and a plurality of electrodes 220 buried in the base layer 210. The electrodes 220 are communicated to an external power supply (not illustrated), the external power supply may provide a voltage to the electrodes 220 to generate electrostatic forces sufficient to hold the wafer 20 in suitable position. That is, the clamping device 200 may be an electrostatic clamping device. The electrodes 220 may include conductive materials such as metals, metal alloys, metal nitrides, metal silicides, or combinations thereof. The base layer 210 may include an insulating ceramic material. In some embodiments, the clamping device 200 is free of channels which gases flow therein.

In some embodiments, as shown in FIG. 3, the heating/cooling units 1000 may each include a dielectric layer 302, a first and second electrodes 304a and 304b, a first and a second semiconductor layers 306a and 306b, and a conductive layer 308. The first electrode 304a and the second electrode 304b are spaced apart from each other and are formed in the dielectric layer 302. The conductive layer 308 is formed in the dielectric layer 302 and is disposed above the first electrode 304a and the second electrode 304b. The first semiconductor layer 306a is formed in the dielectric layer 302 and disposed between the first electrode 304a and the conductive layer 308 and has a first conductivity type (e.g., N-type). The second semiconductor layer 306b is formed in the dielectric layer 302, disposed between the second electrode 304b and the conductive layer 308, and spaced apart from the first semiconductor layer 306a. The second semiconductor layer 306b has a second conductivity type (e.g., P-type) different from the first conductivity type. The first electrode 304a and the second electrode 304b may be electrically connected to an external power supply (not shown), respectively, so that the external power supply can generate a bias between the first electrode 304a and the second electrode 304b and thus the current flows from the first semiconductor layer 306a to the second semiconductor layer 306b. In this case, the temperature of the conductive layer 308 located at the tops of the first and second semiconductor layers 306a and 306b will decrease to form an endothermic end, while the temperature of the first and second electrodes 304a and 304b respectively located at the bottom of the first and second semiconductor layers 306a and 306b will increase to form an exothermic end. As such, the heat generated by the semiconductor processes that are performed on the wafer 20 can be cooled by the conductive layer 308, and the heat generated by the first and second electrodes 304a and 304b can be transferred to the substrate 100 and then may be transferred to the outside through the cooling water in the pipe 120, for example. That is, the heat generated during the semiconductor processes that are performed on the wafer 20 can be transferred to the wafer chuck 10 below and then further transferred to the outside.

Based on the above, since the heating/cooling wafer 300 does not dissipate the heat generated during the process by providing cooling gas (such as helium gas) on the rear side of the wafer 20, it is able to adjust or compensate the temperature of the process.

In some embodiments, the conductive layer 308 in the heating/cooling unit 1000 is in contact with or directly in contact with the die 2000.

In some embodiments, the dielectric layer 302, the first and second electrodes 304a and 304b, the first and second semiconductor layer 306a and 306b, and the conductive layer 308 may be integrated to the semiconductor processes such as a process for forming interconnections. Since heating/cooling units 1000 are manufactured in a way similar to the semiconductor wafer, it can also be referred to as a heating/cooling wafer. In some embodiments, the heating/cooling wafer 300 is formed by using the semiconductor processes, and before integrating with the clamping device 200, a thinning process is performed on the rear of the heating/cooling wafer 300, but the cutting process does not perform on the heating/cooling wafer 300.

In some embodiments, each heating/cooling unit 1000 may include a temperature sensor (not shown) to measure the temperature of the corresponding die 2000. In some embodiments, the heating/cooling wafer 300 may include a controller (not shown), wherein the controller can receive a signal from the temperature sensor and adjust the bias provided between the first electrode 304a and the second electrode 304b. In some embodiments, the controller can adjust the bias, by controlling the output current, provided between the first electrode 304a and the second electrode 304b with reference to the ambient temperature (as a safety reference point) as well as the single-point set temperature and the single-point feedback temperature.

In summary, in the aforementioned embodiment of the wafer chuck, the heating/cooling wafer is disposed on the surface of the substrate that faces the wafer to be carried and includes the plurality of heating/cooling units arranged in the array. As such, the heat generated during the semiconductor processes can be cooled through the heating/cooling wafer without cooling through the cooling gases. Therefore, during the step of removing the electrostatic force used to clamp the wafer, the wafer will not be blown away by the cooling gases remaining in the channels, thereby avoiding the result that the wafer is smashed into fragments. On the other hands, even if the particles generated during the process adhere to the space between the wafer chuck and the wafer, the unnecessary shutdown procedure caused by the leakage of the cooling gases in an amount that does not affect the process will not occur.

In other aspects, since the positions of the heating/cooling units are designed to correspond to the positions of the dies included in the wafer to be carried, the corresponding heating/cooling units are capable of heating or cooling corresponding dies independently.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A wafer chuck, comprising:
   a substrate comprising a first surface facing a wafer to be carried and a second surface opposite to the first surface; and
   a heating/cooling wafer disposed on the first surface of the substrate and comprising a plurality of heating/cooling units arranged in an array, wherein positions of the heating/cooling units and positions of a plurality of dies comprising in the wafer to be carried are corresponded to each other in a direction perpendicular to the first surface, so that the heating/cooling units are capable of heating or cooling corresponding dies independently,
   wherein the substrate comprises a pipe buried therein, the pipe comprises an inlet and an outlet at opposite ends of the pipe, and the inlet and the outlet are opened on the second surface of the substrate, and
   wherein each of the heating/cooling units comprises:
      a first and a second electrodes spaced apart from each other;
      a conductive layer above the first and the second electrodes;
      a first semiconductor layer between the first electrode and the conductive layer and having a first conductivity type; and
      a second semiconductor layer between the second electrode and the conductive layer and being spaced apart from the first semiconductor layer, wherein the second semiconductor layer has a second conductivity type different from the first conductivity type.

2. The wafer chuck of claim 1, wherein the plurality of heating/cooling units overlap the plurality of dies in the direction perpendicular to the first surface.

3. The wafer chuck of claim 1, further comprising:
   a clamping device disposed between the substrate and the heating/cooling wafer and comprising a plurality of electrodes.

4. The wafer chuck of claim 3, wherein the clamping device is free of a channel which gas flows therein.

5. The wafer chuck of claim 1, wherein a channel which cooling gas flows therein does not exist between the first surface of the substrate and the wafer to be carried.

6. The wafer chuck of claim 1, wherein the conductive layer contacts the die.

* * * * *